United States Patent
Hoffmann et al.

(10) Patent No.: US 6,762,536 B2
(45) Date of Patent: Jul. 13, 2004

(54) PIEZOCERAMIC BENDING TRANSDUCER AND USE THEREOF

(75) Inventors: Markus Hoffmann, Wolfsschlugen (DE); Karl Lubitz, Ottobrunn (DE); Michael Riedel, Rödental (DE); Michael Weinmann, Plüderhausen (DE)

(73) Assignees: Siemens Aktiengesellschaft, Munich (DE); Festo AG & Co., Esslingen (DE)

( * ) Notice: Subject to any disclaimer, the term of this patent is extended or adjusted under 35 U.S.C. 154(b) by 38 days.

(21) Appl. No.: 10/257,322
(22) PCT Filed: Apr. 6, 2001
(86) PCT No.: PCT/DE01/01371
§ 371 (c)(1), (2), (4) Date: Oct. 10, 2002
(87) PCT Pub. No.: WO01/78160
PCT Pub. Date: Oct. 18, 2001

(65) Prior Publication Data
US 2003/0076009 A1 Apr. 24, 2003

(30) Foreign Application Priority Data
Apr. 10, 2000 (DE) .......................................... 100 17 760

(51) Int. Cl.[7] ............................................ H01L 41/083
(52) U.S. Cl. ........................ 310/332; 310/310; 310/331
(58) Field of Search ................................. 310/326–328, 310/330–332, 334, 335

(56) References Cited

U.S. PATENT DOCUMENTS

| 3,629,625 | A | | 12/1971 | Schafft | 310/332 |
|---|---|---|---|---|---|
| 4,438,363 | A | * | 3/1984 | Babitzka et al. | 310/328 |
| 4,633,119 | A | * | 12/1986 | Thompson | 310/325 |
| 5,038,069 | A | * | 8/1991 | Lukasiewicz et al. | 310/338 |
| 5,376,860 | A | * | 12/1994 | Sato | 310/346 |
| 5,473,214 | A | * | 12/1995 | Hildebrand | 310/321 |
| 5,664,456 | A | * | 9/1997 | Eckert | 73/290 V |
| 5,912,679 | A | * | 6/1999 | Takayama et al. | 347/10 |
| 6,429,574 | B1 | * | 8/2002 | Mohr et al. | 310/334 |
| 2003/0160544 | A1 | * | 8/2003 | Riedel et al. | 310/332 |
| 2003/0168941 | A1 | * | 9/2003 | Maichl et al. | 310/330 |

FOREIGN PATENT DOCUMENTS

| DD | 293918 | 9/1991 | H01L/41/09 |
|---|---|---|---|
| DE | 2852795 | 6/1979 | H01L/41/18 |
| DE | 3434726 | 12/1989 | H01L/41/08 |
| EP | 10225146 | 8/1998 | H02N/2/00 |
| WO | 99/17383 | 4/1999 | H01L/41/09 |

* cited by examiner

Primary Examiner—Thomas M. Dougherty
(74) Attorney, Agent, or Firm—Harness, Dickey & Pierce, P.L.C.

(57) ABSTRACT

A piezoelectric bending transducer includes a support body, a stack of piezo-ceramic layers, arranged thereon and flat electrodes arranged between the layers. On the side of the support body facing the stack, an adaptation layer is arranged with essentially the same coefficient of expansion as the piezo-ceramic. The bending transducer displays a good actuating power and a low thermal natural distortion with economical production costs. The transducer is particularly suitable for application in a valve.

29 Claims, 2 Drawing Sheets

PIEZOCERAMIC BENDING TRANSDUCER AND USE THEREOF

This application is the national phase under 35 U.S.C. § 371 of PCT International Application No. PCT/DE01/01371 which has an International filing date of Apr. 6, 2001, which designated the United States of America and which claims priority on German Patent Application number DE 100 17 760.3 filed Apr. 10, 2000, the entire contents of which are hereby incorporated herein by reference.

FIELD OF THE INVENTION

The invention generally relates to a piezocerainic bending transducer having a support body and having a stack of layers. Preferably, the layers include piezoceramic and planar electrodes arranged between the layers, wherein the stack is applied to the support body. The invention also generally relates to the use of a bending transducer of this type.

BACKGROUND OF THE INVENTION

A piezoceramic bending transducer is known from DE 293 918 A5 and WO 99/17383. According to WO 99/17383, to actuate the piezoceramnic bending transducer, the electrodes arranged between the layers of piezoceramic are alternately set to positive and negative potential, as seen in the stacking direction. Respectively adjacent layers of piezoceramic are polarized in opposite directions, so that the stack as a whole, when the operating voltage is applied, undergoes either a contraction or an expansion on account of the piezoelectric effect of the piezoceramic.

Further possible ways of actuating a stack comprising layers of piezoceramic of this type are known from DE 34 34 726 C2.

Furthermore, DE 34 34 726 has disclosed, as material for the piezoceramic in the layers, lead titanate, barium titanate, lead zirconium titanate or modifications of the ceramic substances. As material for the support body, DD 293 918 A5 has disclosed spring steel, and WO 97/17383 has disclosed a fiber composite material or glass. The support body made from a fiber composite material or from glass leads to a good efficiency for the conversion of electrical energy into mechanical energy.

A piezoelectric bending transducer with a support body is generally constructed as what is known as a trimorph. By this, the support body is coated on both sides with, in each case, at least one piezoelectrically active layer of piezoceranric. On account of the symmetrical structure, the temperature-induced internal bending of a piezoceramic bending transducer of this type is lower than if the support body were to be coated on only one side.

If a stack including a large number of piezoceramlc layers is used instead of a single piezoceramic layer, the same mechanical energy is provided at a lower operating voltage. The reason for this is that, on account of the low thickness of the individual piezoceramic layers in a stack, at the same operating voltage in accordance with E=U/d, where E is the electric field, U is the applied voltage and d is the thickness of the ceramic layer, a greater electrical field strength results than if a single layer of the same thickness of the stack is used. Building up the piezoelectrically active substance in the form of a stack with a large number of individual layers of piezocerarnic, i.e. in multilayer technology, is advantageous if short displacement paths and high displacement forces are required for the piezoceramic bending transducer.

For the latter reason, piezoceramic bending transducers of stacked or multilayer design are preferred in particular for applications in a valve. However, a drawback is that the production and materials costs for a piezoceramic bending transducer of multilayer design are relatively high. The piezoceramic layers have to be drawn as films; a large number of individual electrode layers are required, and this fact increases the materials costs (AgPd). Accordingly, when a piezoceramic bending transducer of multilayer design is used, a valve, despite having better actuation properties, would not be competitive compared to a similar valve of conventional design, on account of the high unit price.

SUMMARY OF THE INVENTION

Therefore, it is an object of an embodiment of the invention to provide a piezoceramic bending transducer of multilayer design which can be produced at low cost. A further object of an embodiment of the invention is to provide a use for a piezoceramic bending transducer of this type.

For a piezoceramic bending transducer, an object may be achieved, according to an embodiment of the invention, by the fact that a matching layer including a material which has substantially the same coefficient of thermal expansion as the piezoceramic bending, may be applied to that side of the support body which is remote from the stack.

An embodiment of the invention is based on the consideration that, when the piezoceramic bending transducer is used in a valve, only two defined positions of the bending transducer are required. In one defined position of the bending transducer, the valve must be closed, and in the other defined position of the bending transducer, the valve must be open. There is no need for a further, third defined position of the bending transducer. Depending on the way in which the bending transducer is actuated, one speaks of a normally open valve, in the valve is open when the bending transducer is not actuated, and of a normally closed valve, if the valve is closed when the bending transducer is not actuated.

Furthermore, an embodiment of the invention is based on the consideration that the two positions of the piezoceramic bending transducer which are required in order to control a valve are defined by its at-rest position when voltage is not applied and by a diverted position when voltage is applied. Accordingly, all that is required is for the bending transducer to deviate in one direction. Therefore, for a bending transducer which is used in a valve, it is sufficient for the stack including layers of piezoceramic, referred to below as the piezostack, to be applied to one side of the support body. This is because a second piezostack, which is actuated in the opposite direction to the polarization direction, makes only a small contribution to the deviation, since the field strength has to be limited on account of dipolarization effects. Accordingly, one piezostack can be dispensed with without restricting the performance of the bending transducer for use in valves. This represents a cost-cutting measure, since the production of a piezostack, comprising a large number of individual piezoceramic layers with electrodes between them, is expensive. Furthermore, an embodiment of the invention may be based on the consideration that a piezoceramic bending transducer having a support body and a piezostack applied to one side thereof, on account of its asymmetrical structure, has a higher thermally induced internal bending than a bending transducer having a support body and piezostacks applied to both sides of this body, and to this extent would be unsuitable for use in a valve. This problem is solved by the fact that a matching layer including a material with substantially the same coefficient of thermal expansion as the piezoceramic is applied to that side of the support body which is remote from the stack.

The matching layer advantageously includes a glass or an aluminum oxide. These two materials have a similar coefficient of thermal expansion to the lead zirconate titanium oxide ceramic which is customarily used as piezoceramic.

A piezoceramic generally acquires its piezoelectric properties through being polarized in a homogeneous electrical field. A change in the coefficient of thermal expansion of the piezoceramic is associated with the polarization. In a further advantageous configuration of an embodiment of the invention, therefore, the matching layer includes a polarized piezoceramic, in order to compensate for the thermally induced internal bending of the bending transducer. In this case, the coefficient of thermal expansion of the matching layer is identical to the coefficient of thermal expansion of the individual layers of piezoceramic in the stack which has been applied to the other side of the support body. In this case, the matching layer consists of a monolithic polarized piezoceramic, i.e. of a single layer of piezoceramic.

By way of example, the material used for the support body may be glass, metal or a fiber composite material. However, with a view to ease of processing and to achieving a permanent bond between piezoceramic and support body, it has proven advantageous for the support body to consist of a fiber composite material.

In particular, a permanent and secure bond between a piezoceramic and the support body can be formed if the fiber composite material is an epoxy resin reinforced with carbon or glass fibers. In this case, to produce such a material, the starting material used for the support body is an epoxy resin prepreg (an as yet uncured blank) which is thermally bonded to the piezoceramic by a heat treatment.

In a further advantageous configuration of an embodiment of the invention, a free part of the support body, on a securing side, extends beyond the stack and beyond the matching layer. The free part of the support body can easily be used to secure the bending transducer. This configuration also allows simple contact to be made with the individual electrodes in the piezostack. By way of example, a small copper plate may be adhesively bonded to the free part of the support body, this plate extending partially beneath the piezostack, where it makes electrical contact with the respective electrodes. Then, a connection wire can easily be soldered onto this small copper plate. Advantageously, the electrodes are guided out of the piezoceramic on the securing side, in order for electrical contact to be made, and are set back with respect to the piezoceramic on the other sides. In this way, the electrodes, which are designed as a sheet-like metallization, only lead out of the piezostack or out of the matching layer on the securing side. When the piezostack is being sintered together, the set-back position of the electrodes leads to the formation of a sintered skin on the outer sides, which tightly seals off the electrodes from the environment after the sintering process has concluded. Therefore, designing the electrodes in this way within the piezostack allows the piezoceramic bending transducer to operate even under high levels of atmospheric humidity or in water. The individual electrodes are very well electrically insulated from one another by the sintered skin, which increases the protection against short circuit in the piezostack.

Furthermore, with regard to the prevention of short circuit in the piezoceramic bending transducer, it is advantageous if the part of the electrodes which leads out of the piezostack or potting compound is sealed on the securing side by a potting compound. For this purpose, the bending transducer is placed into a mold which is then filled with the potting compound.

With a view to ease of handling, it is advantageous if the potting compound is an epoxy resin. It is also possible for adhesives which can be cured in particular by means of a laser to be used as potting compound. Surrounding the bending transducer with a potting compound means that the entire piezoceramic bending transducer is protected against moisture, and can therefore itself be used in liquid-carrying valves.

With regard to the use, an object may be achieved, according to an embodiment of the invention, by the piezoceramic bending transducer being used as an actuator in a valve, in particular in a pneumatic valve. A valve of this type, on account of its good price/performance ratio, is able to compete with a conventional valve.

BRIEF DESCRIPTION OF THE DRAWINGS

Exemplary embodiments of the invention are explained in more detail with reference to the drawings, in which.

DETAILED DESCRIPTION OF THE PREFERRED EMBODIMENTS

Figure 1:
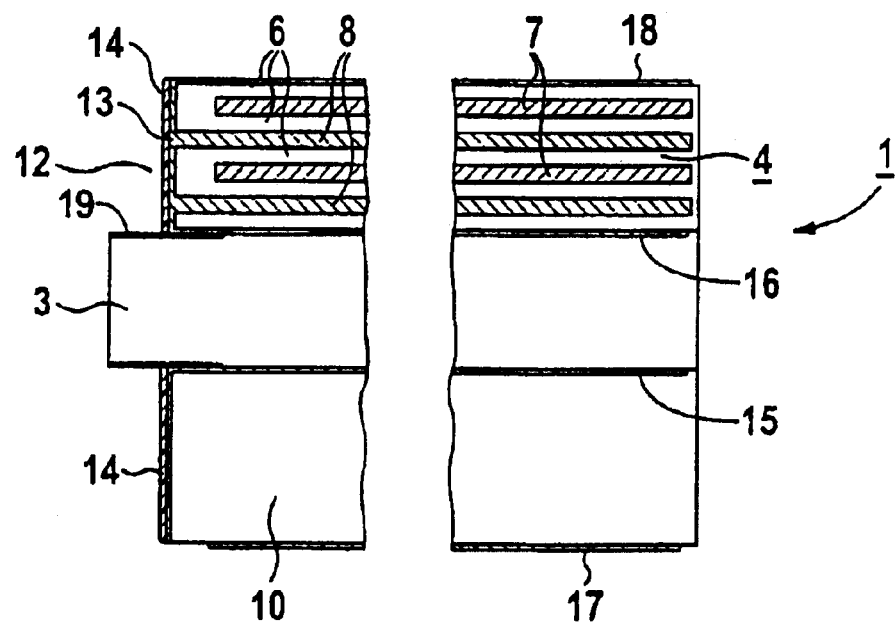
FIG. 1 shows a longitudinal section through a piezoceramic bending transducer having a support body, which on one side is coated with a stack including layers of piezoceramic and on the other side is coated with a matching layer in the form of a monolithic piezoceramic.

FIG. 1 shows a longitudinal section through a piezoceramic bending transducer 1 having a support body 3 made from an epoxy resin reinforced with glass fibers. A stack 4 comprising a number of layers 6 of piezoceramic in each case having electrodes 7, 8, in the form of a silver/palladium metallization layer, arranged between them, is applied to one side of the support body 3. A matching layer 10 including a monolithic piezoceramic is applied to that side of the support 3 which is remote from the stack 4.

A free part of the support body 3 extends outward on the securing side 12 of the piezoceramic bending transducer 1. As can be seen in the longitudinal section, parts 13 of the electrode 8 lead outward from the stack 4 on the securing side 12, where they are in electrical contact with one another. Although this is not visible in the longitudinal section shown, the electrodes 7 also lead outward in the same way and are likewise in contact with one another elsewhere (cf. FIG. 2). The part 13 of the electrodes 7, 8 which leads outward is sealed on the securing side 12 with a potting compound 14 comprising epoxy resin.

Furthermore, the stack 4 has an inner electrode 16, which faces the support body 3, and an outer electrode 18, likewise in the form of a silver/palladium metallization. The inner and outer electrodes 16 and 18 may also be omitted. This is advantageous, for example, when the bending transducer is operated in a moist environment. The matching layer 10 is also provided with an inner electrode 15 and an outer electrode 17. Both the layers 6 of piezoceramic of the stack 4 and the monolithic piezoceramic of the matching layer 10 are polarized when a predetermined voltage is applied via the electrodes 7 and 8, 16 and 18, and 15 and 17. Therefore, the matching layer 10 has the same coefficient of thermal expansion as the layers 6 of piezoceramic. The piezoceramic used is a lead zirconate titanium oxide ceramic.

A small copper plate 19, which extends partially beneath the stack 4, is adhesively bonded to the support body 3 on the securing side 12 of the piezoceramic bending transducer 1. Beneath the stack, the small copper plate 19 is in electrical contact with the electrodes 8, as can be seen from the longitudinal section. To supply the electrodes 8 with a voltage, a connection cable is soldered onto the small copper plate 19.

Figure 2:
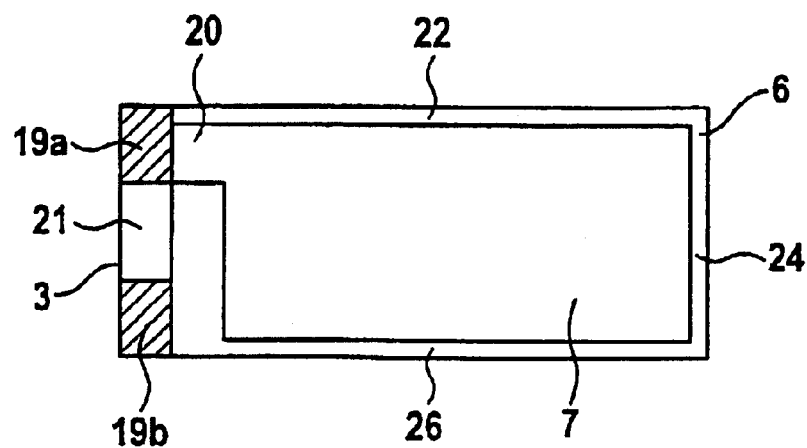
FIG. 2 shows a cross section through the piezoceramic bending transducer as shown in FIG. 1.

FIG. 2 shows a cross section through the piezoceramic bending transducer shown in FIG. 1. The cross section is selected in such a way that it is possible to see an electrode 7 as shown in FIG. 1. It can clearly be seen that, to make contact with the electrodes 7, a small copper plate 19a is used and, to make contact with the electrodes 8, a small copper plate 19b is used. For this purpose, an electrode part 20 leads out of the stack, and on the outside makes contact with the small copper plate 19a. The small copper plates 19a and 19b are adhesively bonded onto the free part 21 of the support body. Furthermore, it is clear that the electrodes the electrodes 7 are illustrated—are set back with respect to the layers of piezoceramic 6 on the sides 22, 24 and 26. This set-back arrangement improves the protection against short circuits in the piezoceramic bending transducer when moisture is present. The free part 21 of the support body 3 is shown in a perspective illustration in FIG. 3. It is clearly apparent that the small copper plate 19a is in electrical contact with all the electrodes 8 and the small copper plate 19b is in electrical contact with all the electrodes 7. If a voltage is applied between the small copper plates 19a and 19b, the electrical field runs in opposite directions in adjacent layers 6 of piezoceramic. Since the polarization directions of adjacent layers 6 of piezoceramic likewise face in opposite directions, the application of an electric voltage accordingly leads to a contraction or an expansion of all the layers 6 of the stack 4 and therefore to an overall contraction or expansion of the stack 4. If the free part 21 of the support body 3 is held fixedly in place, the application of a voltage to the small copper plates 19a and 19b therefore leads to a deviation of the other end of the bending transducer 1.

Figure 3:
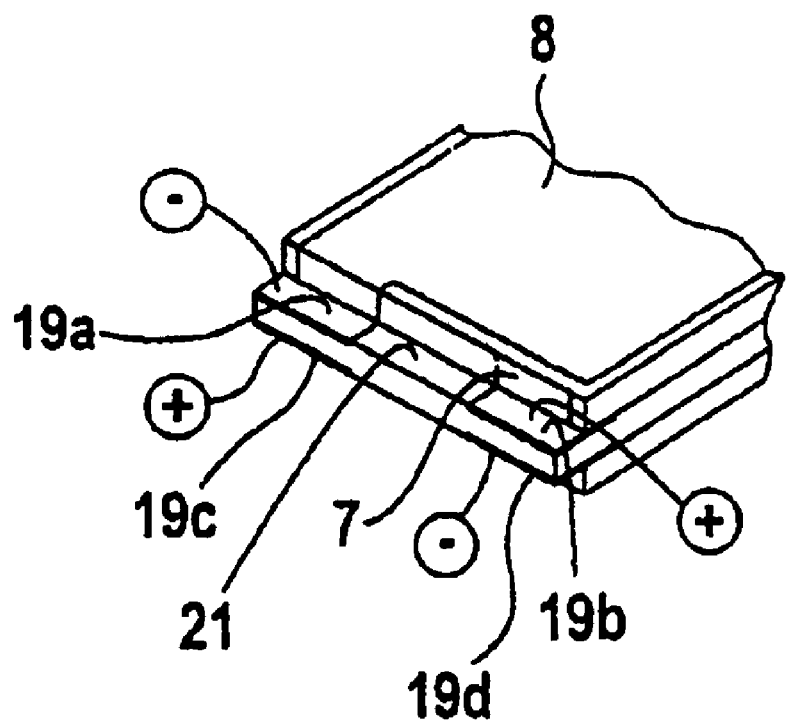
FIG. 3 shows a three-dimensional illustration of the securing side of the piezoceramic bending transducer shown in FIG. 1.

Furthermore, it can also be seen from FIG. 3 that the piezoceramic of the matching layer 10 can likewise be polarized by means of the small copper plates 19c and 19d when a voltage is applied.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claim is:

1. A piezoceramic bending transducer, comprising:
   a support body;
   a stack of piezoceramic layers;
   planar electrodes, arranged between the layers, wherein the stack is applied to the support body; and
   a matching layer, including a material which has substantially the same coefficient of thermal expansion as at least one of the piezoceramic layers, applied to a side of the support body which is remote from the stack.

2. The piezoceramic bending transducer as claimed in claim 1, wherein the matching layer includes at least one of a glass and an aluminum oxide.

3. The piezoceramic bending transducer as claimed in claim 1, wherein the matching layer includes a polarized piezoceramic.

4. The piezoceramic bending transducer as claimed in claim 1, wherein the support body includes a fiber composite material.

5. The piezoceramic bending transducer as claimed in claim 4, wherein the fiber composite material is an epoxy resin reinforced with at least one of a carbon and glass fibers.

6. The piezoceramic bending transducer as claimed in claim 1, wherein a free part of the support body, on a securing side, extends beyond the stack and beyond the matching layer.

7. The piezoceramic bending transducer as claimed in claim 6, wherein the electrodes lead out of the piezoceramic on the securing side, in order for electrical contact to be made, and are set back with respect to the piezoceramic on the other sides.

8. The piezoceramic bending transducer as claimed in claim 7, wherein the projecting part of the electrodes is sealed on the securing side with a potting compound.

9. The piezoceramic bending transducer as claimed in claim 8, wherein the potting compound is an epoxy resin.

10. A valve, including an actuator including the piezoceramic bending transducer as claimed in claim 1.

11. The piezoceramic bending transducer as claimed in claim 2, wherein the support body includes a fiber composite material.

12. The piezoceramic bending transducer as claimed in claim 11, wherein the fiber composite material is an epoxy resin reinforced with at least one of a carbon and glass fibers.

13. The piezoceramic bending transducer as claimed in claim 3, wherein the support body includes a fiber composite material.

14. The piezoceramic bending transducer as claimed in claim 13, wherein the fiber composite material is an epoxy resin reinforced with at least one of a carbon and glass fibers.

15. The piezoceramic bending transducer as claimed in claim 2, wherein a free part of the support body, on a securing side, extends beyond the stack and beyond the matching layer.

16. The piezoceramic bending transducer as claimed in claim 15, wherein the electrodes lead out of the piezoceramic on the securing side, in order for electrical contact to be made, and are set back with respect to the piezoceramic on the other sides.

17. The piezoceramic bending transducer as claimed in claim 3, wherein a free part of the support body, on a securing side, extends beyond the stack and beyond the matching layer.

18. The piezoceramic bending transducer as claimed in claim 17, wherein the electrodes lead out of the piezoceramic on the securing side, in order for electrical contact to be made, and are set back with respect to the piezoceramic on the other sides.

19. The valve of claim 10, wherein the valve is a pneumatic valve.

20. A valve, including an actuator including the piezoceramic bending transducer as claimed in claim 2.

21. A valve, including an actuator including the piezoceramic bending transducer as claimed in claim 3.

22. The valve of claim 20, wherein the valve is a pneumatic valve.

23. The valve of claim 21, wherein the valve is a pneumatic valve.

24. A piezoceramic bending transducer, comprising:
a support body;
a plurality of piezoceramic layers arranged thereon;
a plurality of flat electrodes, arranged between the layers; and
an adaptation layer, including a material which has substantially the same coefficient of expansion as at least one of the piezoceramic layers, applied to a side of the support body which is remote from the plurality of piezoceramic layers.

25. The piezoceramic bending transducer as claimed in claim 24, wherein the adaptation layer includes at least one of a glass and an aluminum oxide.

26. The piezoceramic bending transducer as claimed in claim 24, wherein the adaptation layer includes a polarized piezoceramic.

27. The piezoceramic bending transducer as claimed in claim 24, wherein the support body includes a fiber composite material.

28. A valve, including an actuator including the piezoceramic bending transducer as claimed in claim 24.

29. The valve of claim 28, wherein the valve is a pneumatic valve.

* * * * *